United States Patent [19]
Cook et al.

[11] Patent Number: 5,402,885
[45] Date of Patent: Apr. 4, 1995

[54] ACCESS BANK CONTAINER SYSTEM

[75] Inventors: Lawrence G. Cook, Indianapolis, Ind.; Francis R. Krug, Highland, N.Y.; Werner H. Lackner, Hopewell Junction, N.Y.; Thomas J. Walsh, Poughkeeepsie, N.Y.

[73] Assignee: International Business Machines Corporation, Armonk, N.Y.

[21] Appl. No.: 169,919

[22] Filed: Dec. 20, 1993

[51] Int. Cl.⁶ .............................................. B65D 85/42
[52] U.S. Cl. .................................... 206/334; 220/504; 220/507; 220/526
[58] Field of Search ............... 220/504, 526, 344, 507; 206/334, 332

[56] References Cited

U.S. PATENT DOCUMENTS

| | | | |
|---|---|---|---|
| 1,748,934 | 2/1930 | Diamond | 220/334 |
| 2,680,535 | 6/1954 | Thon | 220/32 |
| 3,061,136 | 10/1962 | Sterngart | 220/20 |
| 3,191,791 | 6/1965 | Jackson | 206/332 X |
| 3,225,913 | 12/1965 | Lee | 206/42 |
| 3,822,925 | 7/1974 | Osroff | 312/242 |
| 4,494,651 | 1/1985 | Malcolm | 206/328 |
| 4,815,596 | 3/1989 | Reid | 206/334 |

OTHER PUBLICATIONS

Western Electric Technical Digest No. 30, Apr. 1973; "Integrated Circuit Shipping Package" by Egan et al.
Western Electric Technical Digest No. 15, Jul. 1969; "Package for Transporting Beam-Lead Devices on a Substrate" by Wanesky.
IBM Technical Disclosure Bulletin vol. 20 No. 11A, Apr. 1978; "Linear Chip Bank" by Formichelli et al.
IBM Technical Disclosure Bulletin vol. 28, No. 8, Jan. 1986; "Chip Access, Storage, Transport Bank" no author.

*Primary Examiner*—Jacob K. Ackun
*Attorney, Agent, or Firm*—Whitham, Curtis, Whitham & McGinn; Michael J. Balconi-Lamica

[57] ABSTRACT

The provision of a container system that has a compartmented core surrounded by a carrier body frame to which top and bottom covers are removably attached. A band of resilient sealing material (e.g., a closed cell inert polymer or a rubber) on the top and bottom covers each completely surrounds the compartment core, and three ribs on the top and bottom of each of the covers likewise frame the compartment core, so that the ribs engage the resilient sealing material and form a barrier that completely surrounds the compartment core.

8 Claims, 3 Drawing Sheets

ACCESS BANK CONTAINER SYSTEM

BACKGROUND OF THE INVENTION

1. Field of the Invention

This invention relates to an improved access bank container system for storing, transporting and providing robotic access to sensitive components such as semiconductor chips and, more particularly, to an access bank container system that provides a sealed environment for the components during storage and shipping and precise, automated, random access to the components when mounted onto a robotic component handling machine.

2. Description of the Prior Art

There are a number of prior art containers for storing, shipping and facilitating automated access of semiconductor chips and other similar electronic components. However, these prior art containers do not adequately meet the needs of the electronics industry for a container that provides environmental protection, easily automated one or two-sided access to the components, and precision alignment of components in the automated handling equipment.

SUMMARY OF THE INVENTION

An object of this invention is the provision of a container that more closely meets the needs of the electronics industry. Namely, a container with easily removable top and bottom covers that seal the components from the environment when in place. A container that provides three-point precision orientation of the container in the robotic component handling equipment.

A further object of this invention is the provision of a container system that is adaptable to components of different sizes and shapes with change in the basic system components.

A still further object of the invention is the provision of a container system that is economical to manufacture.

A more specific object of the invention is the provision of an inexpensive but tight environmental seal.

Briefly, this invention contemplates the provision of a container system that has a compartmented core surrounded by a carrier body frame to which top and bottom covers are removably attached. A band of resilient sealing material (e.g., a closed cell inert polymer or a rubber) on the top and bottom covers each completely surrounds the compartment core, and three ribs on the top and bottom of each of the covers likewise frame the compartment core, so that the ribs engage the resilient sealing material and form a barrier that completely surrounds the compartment core. The two outer ribs urge the resilient sealing material laterally into tight engagement with the center rib. Two slots on the carrier body frame located outboard of the band of sealing material are aligned with one another, and a third slot on the carrier body frame is aligned perpendicularly to the line between the first two slots. The slots are located so that the lines cross at the center of the compartment core, so that when the external shot pins on the robotic machine engage the slots, the center of the compartment core is precisely positioned with respect to the machine.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
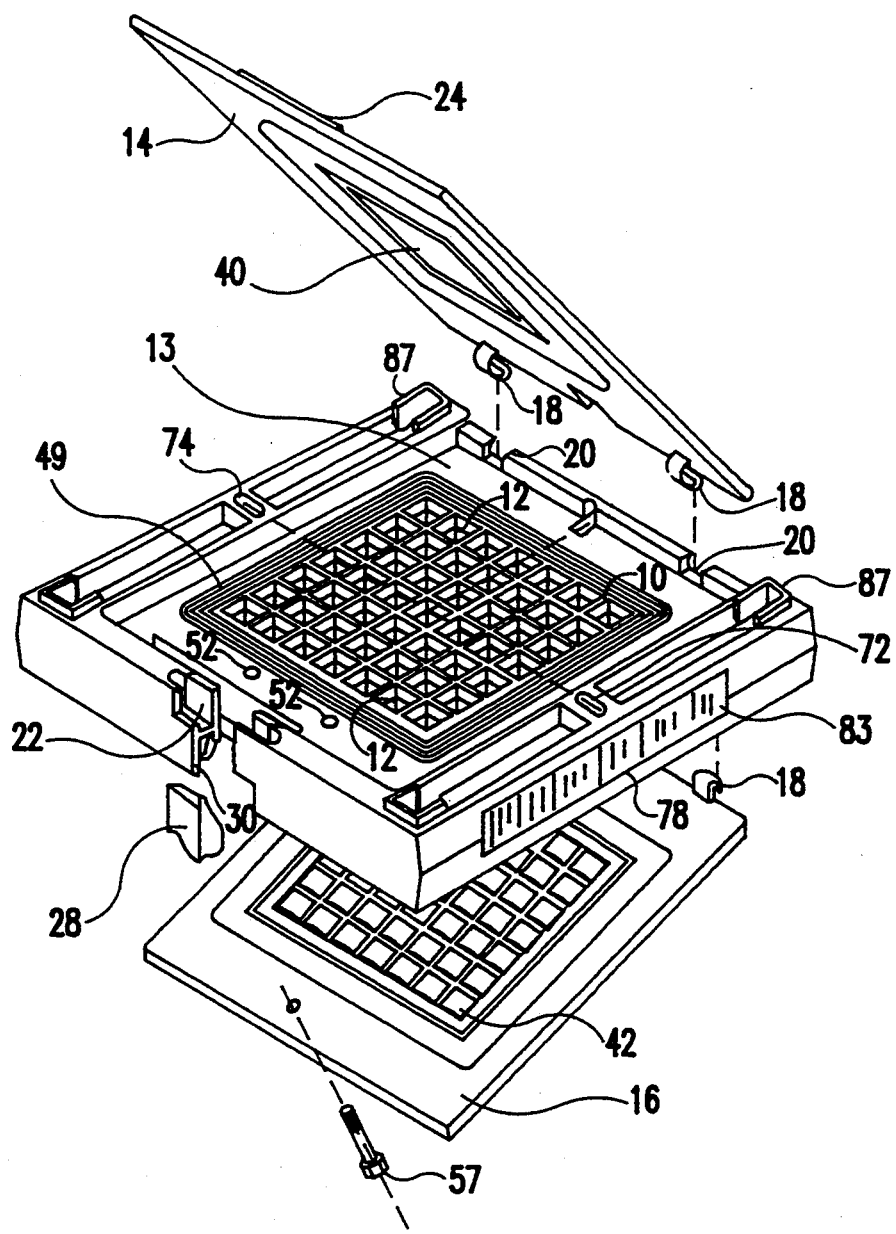
FIG. 1 is an isometric view of one embodiment of a container system in accordance with the teachings of this invention.

Referring now to FIG. 1 of the drawings, the container system in accordance with this embodiment of the invention has a compartmented core 10 comprised of square cells 12 that are open on the top and bottom. It will be appreciated that core 10 illustrated here is merely exemplary, and that other configurations to suit a particular application are easily realizable. A carrier body frame 13 surrounds the compartmented core, and a top cover 14 and a bottom cover 16 are respectively attached along one side to the body frame by hooks 18 on the covers that engage bars 20 on the carrier body frame 13. When engaged, the hooks 18 and bars 20 act as a hinge, allowing the top and bottom covers to be closed over the compartmented core 10. In this closed position, a resilient snap latch 22 engages a locking surface 24 on the top cover and secures the top cover in place. A similar snap latch adjacent the latch 22, and a locking surface (not shown) on the bottom cover, secure the bottom cover in place. Upward movement of a wedge tool 28 in a release slot 30 releases the top cover, and a similar downward motion releases the bottom cover.

Figure 2:
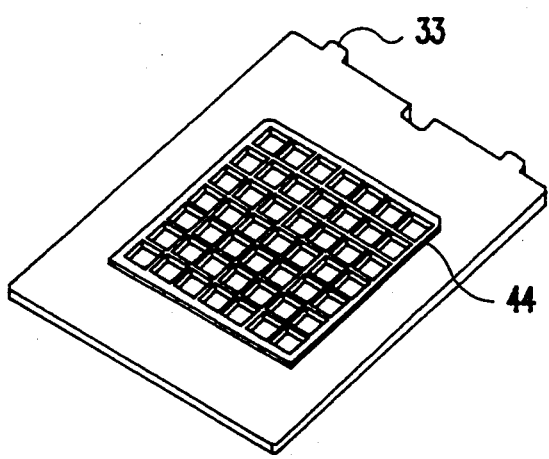
FIG. 2 is an isometric view of an interchangeable wash cover for the container system.

Here it will be appreciated that when the latch is released from the cover and the cover is rotated clear of the frame, the cover may be easily removed from the frame by sliding the hooks out from under the pins. Typically, when in place in a robotic machine, the lower cover is in a locked position with its respective latch, holding it in place, and the upper cover latch is forced outward by a wedge tool 28, allowing the upper cover to be removed robotically by a vacuum lift arm or other suitable means. In the embodiment of FIG. 1, the upper cover has a pad surface 40 and the lower cover has entry pads 42, that enter the cells 12 to facilitate the safe handling of thin devices or thin semiconductor chips. The covers may be designed to meet specific shipping and/or processing needs. For example, the top cover may be replaced with a wash cover such as that shown in FIG. 2. Here, the cover has flow-through mesh or screen windows 44 aligned with the cells 12 to allow deflected or flow-through washing of the components in the cells, depending upon whether or not a bottom cover is used.

Figure 3:
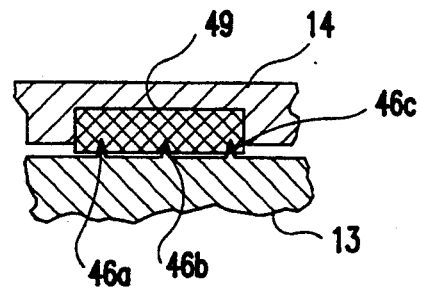
FIG. 3 is a partial sectional view along the line 3—3 of FIG. 1, showing a detail of the seal in accordance with a preferred embodiment of the invention.

Referring now to FIG. 3 as well as FIG. 1, the top and bottom surfaces of the frame 13 have a band comprised of three ribs, 46a, 46b and 46c. The band on each side of the frame extends completely around the periphery of the compartmented core 10. On the inner surface of each of the top and bottom covers, there is a matching band 49 comprised of a deformable resilient material such as a closed cell inert polymer or rubber. As best seen in FIG. 3, when a cover is closed, the ribs press into the sealing band 49 and the two outer ribs 46a and 46c squeeze the sealing band material into tight engagement with the central rib 46b. This provides a tight seal around the compartmented core when the covers are closed and latched.

Figure 4:
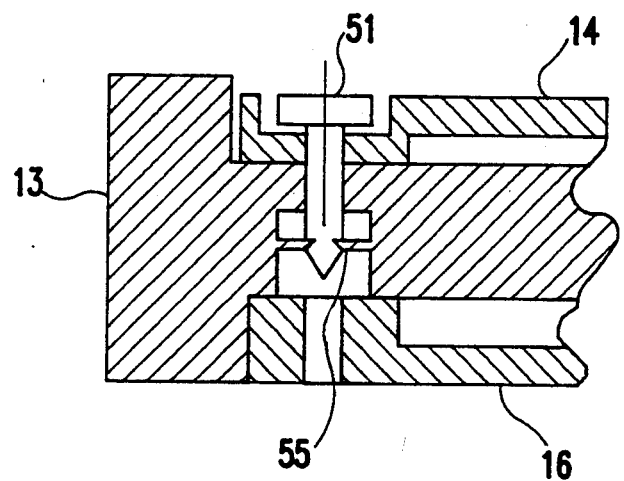
FIGS. 4 and 5 are partial sectional views of tamper resistant lock assemblies for the container system.
Figure 5:
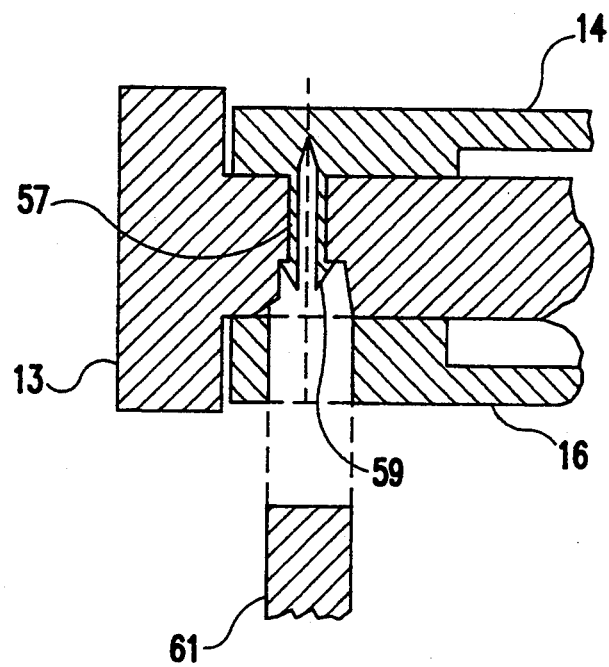

Referring now to FIGS. 4 and 5 in addition to FIG. 1. In the embodiment of FIG. 4, a security lock system is comprised of a pin 51, which can be separate from or formed integrally with the cover, is inserted into an opening 52 in the carrier body frame. The pin 51 has a notch ring 54 which is engaged by a latch tab 55 to secure the pin in place and the cover closed until the pin is removed. The embodiment of FIG. 5 provides a more secure security lock. Here a split pin 57 is part of the cover and only can be disengaged with a proper tool. The pin 57 has displaceable latch fingers 59 that engage latch surfaces in an opening in the frame body. Cam surfaces on the pin 57 are cammed inwardly to release the latch fingers from the latch surfaces when a tool 61 engages the pin in an upward movement.

Three elongated slots 72, 74 and 76, establish a fixed line, rotational lock, precision point location of the container system when it is mounted on a robotic system. External shot pins (part of the robotic system and not shown here) enter the slots 72 and 74 thereby establishing a centerline 78 through the compartmented core. The container system can move laterally with respect to slot 76, and when a third shot pin is inserted in slot 76 the center of the compartmented core is fixed relatively to the robotic machine on which the container system has been mounted, allowing precision addressing of the compartments relative to the center and the centerline 78. A bar code 83 can be affixed to the side of the carrier body frame, and projections 87 on one side of the frame, in conjunction with receivers on the other side of the frame, allow the carrier system to stack, if desired.

Figure 6:
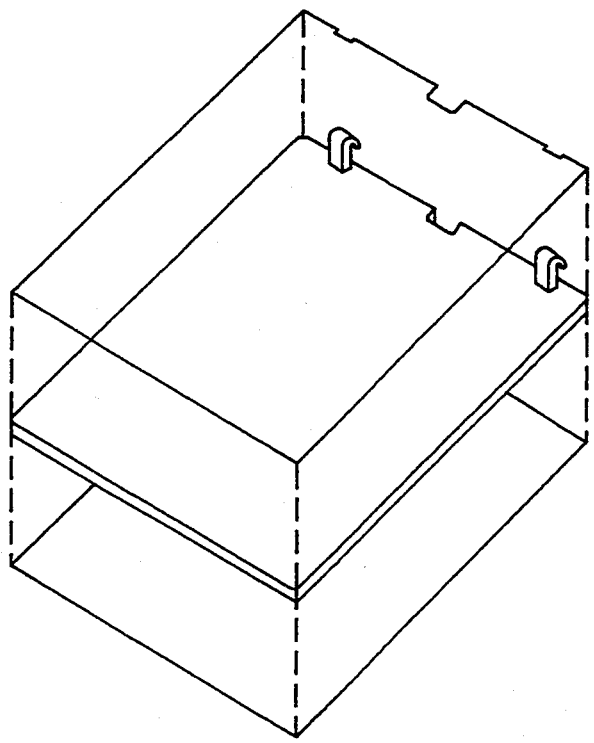
FIG. 6 is an isometric view of an anti-static co-molded transparent cover for the container system.

FIG. 6 shows a composite cover with antistatic surface(s) applied thereto surface, which when used with a conductive, static dissipative, or anti-static body, provides a electrostatic safe envelope package. The shot pin entry into the three-point engagement holes provides common electrical connection. The handling of the container system can be accomplished with recognized safe electrostatic handling procedures.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A container system for storing, transporting, and providing access to components, comprising on combination:

a compartment core for storing said components in segmented cells;

a carrier body frame surrounding said compartment core;

a first sealing band formed on a top surface of said carrier body frame, said first band encircling said compartment core;

a second sealing band on a bottom surface of said carrier body frame, said second sealing band encircling said compartment core;

a top cover with a third sealing band on its inner surface;

wherein at least one of said first sealing band and said third sealing band is a first deformable sealing band and the other of said first sealing band and said third sealing band is a first rib band;

means to removably secure said top cover to said carrier body frame so that said top cover pivots about one edge of said carrier frame and so that when said top cover is in its closed position said first rib band is impressed into said first deformable sealing band forming an environmental seal around said core; and a bottom cover with a fourth sealing band on its inner surface;

wherein at least one of said second sealing band and said fourth sealing band is a second deformable sealing band and the other of said second sealing band and said fourth sealing band is a second rib band; and means to removably secure said bottom cover to said carrier body frame so that said bottom cover pivots about one edge of said carrier frame and so that when said top cover is in its closed position said second rib band is impressed into said second deformable sealing band forming an environmental seal around said core.

2. A container for storing, transporting and providing access to components, comprising in combination:

a compartment core for storing said components in segmented cells;

a carrier body frame surrounding said compartment core;

at least one of a deformable sealing band and a rib band located on a top cover of said carrier body frame, said at least one of a deformable sealing and a rib band encircling said compartment core;

a top cover with another of a deformable sealing band and a rib band on its inner surface; and means to removably secure said top cover to said carrier body frame so that said top cover pivots about one edge of said carrier frame and so that when said top cover is in its closed position said rib band is impressed into said deformable sealing band forming an environmental seal around said core.

3. A container system for storing, transporting, and providing access to components as in claim 1, wherein said first rib band comprises three parallel ribs, two outer ribs and a central rib, said outer ribs urging said first deformable sealing band into engagement with said central rib when said top cover is in its closed position, and wherein said second rib band comprises three parallel ribs, two outer ribs and a central rib, said outer ribs urging said second deformable sealing band into engagement with said central rib when said bottom cover is in its closed position.

4. A container system for storing, transporting, and providing access to components as in claim 2, wherein rib band comprises three parallel ribs, two outer ribs and a central rib, said outer ribs urging said deformable sealing band into engagement with said central rib when said top cover is in its closed position.

5. A container system for storing, transporting, and providing access to components as in claim 1, further including a latch means for securing said top cover and said bottom cover in their respective closed position.

6. A container system for storing, transporting, and providing access to components as in claim 2, further including a latch means for securing said top cover in its closed position.

7. A container system for storing, transporting, and providing access to components as in claim 3, further including a latch means for securing said top cover and said bottom cover in their respective closed position.

8. A container system for storing, transporting, and providing access to components as in claim 4, further including a latch means for securing said top cover in its closed position.

* * * * *